BAND PASS FILTER CIRCUIT

Filed Sept. 29, 1948 2 Sheets-Sheet 1

INVENTOR.
FRED W. SCHMIDT, JR.
BY
Darby & Darby
ATTORNEYS

Dec. 1, 1953 F. W. SCHMIDT, JR 2,661,459

BAND PASS FILTER CIRCUIT

Filed Sept. 29, 1948 2 Sheets-Sheet 2

INVENTOR.
FRED W. SCHMIDT, JR.
BY
Darby & Darby
ATTORNEYS

Patented Dec. 1, 1953

2,661,459

UNITED STATES PATENT OFFICE 2,661,459

BAND PASS FILTER CIRCUIT

Fred W. Schmidt, Jr., Cedar Grove, N. J., assignor to Allen B. Du Mont Laboratories, Inc., Passaic, N. J., a corporation of Delaware Application September 29, 1948, Serial No. 51,728

7 Claims. (Cl. 333—70)

My invention relates to electrical circuits for passing a limited band of frequencies, commonly known to the art as band pass filters, and more specifically to those types of pass band filters where the band of passed frequencies may be tuned, or shifted through a portion of the frequency spectrum.

An object of my invention is to provide a tunable band pass filter having a bandwidth more constant over a wide band of tuned frequencies than those of the prior art.

Another object of my invention is to provide a tunable band pass filter having an impedance more constant with tuning than those of the prior art, so that when used in an amplifying circuit, constant gain over the tuning range is readily obtained.

A third object of my invention is to provide a circuit adapted to a high frequency wide band application such as the input circuits of a television receiver, whose elements are physically realizable, readily available, and relatively inexpensive.

A fourth object of my invention is to provide a tunable band pass filter readily adaptable to the inclusion of a circuit for rejecting a fixed frequency outside of the pass band. In the case of a superheterodyne receiver this can be used as an intermediate frequency trap.

Figure 1:
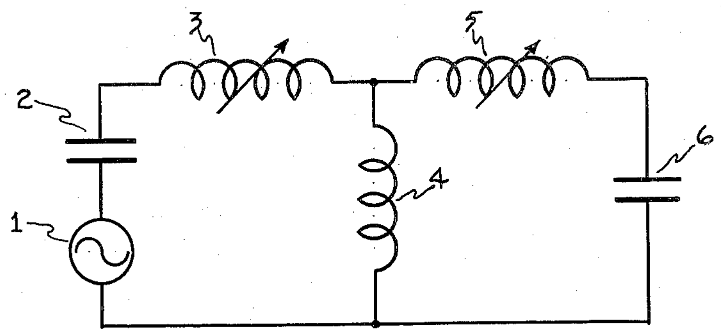
Figure 2:
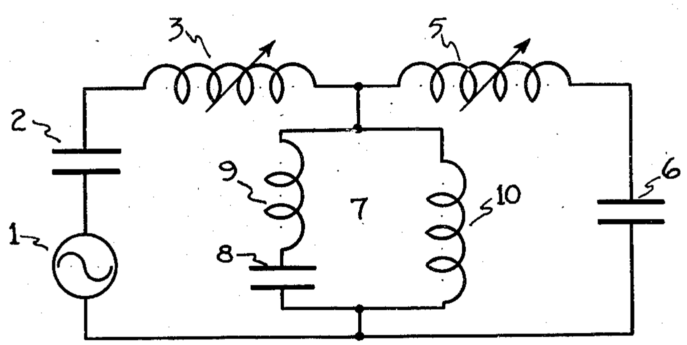
Figure 3:
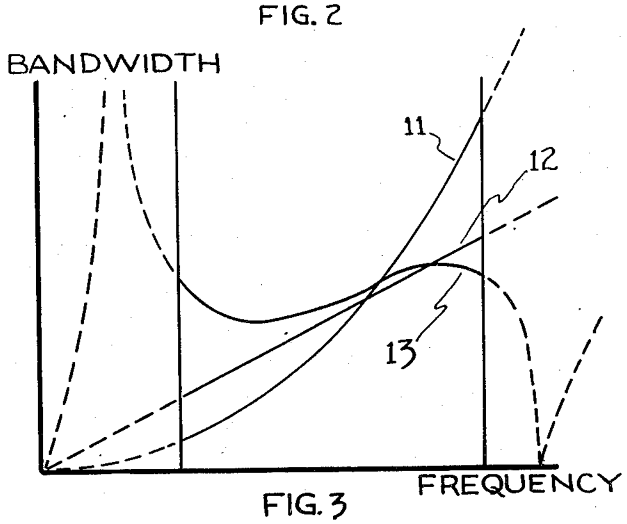
Figure 4:
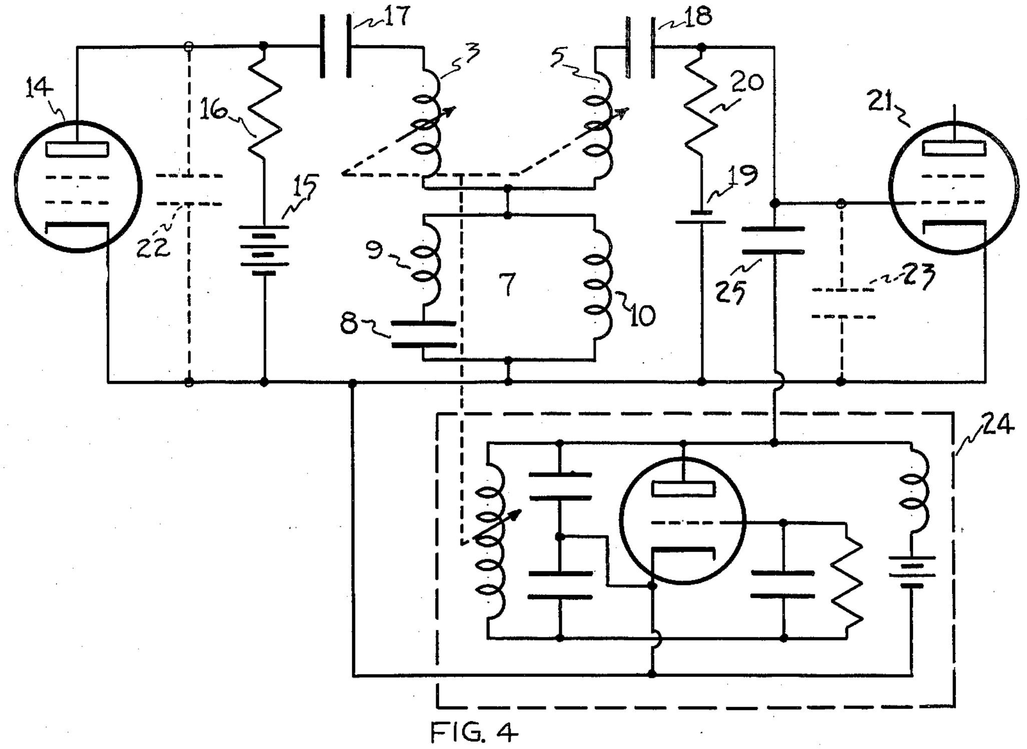
Figure 5:
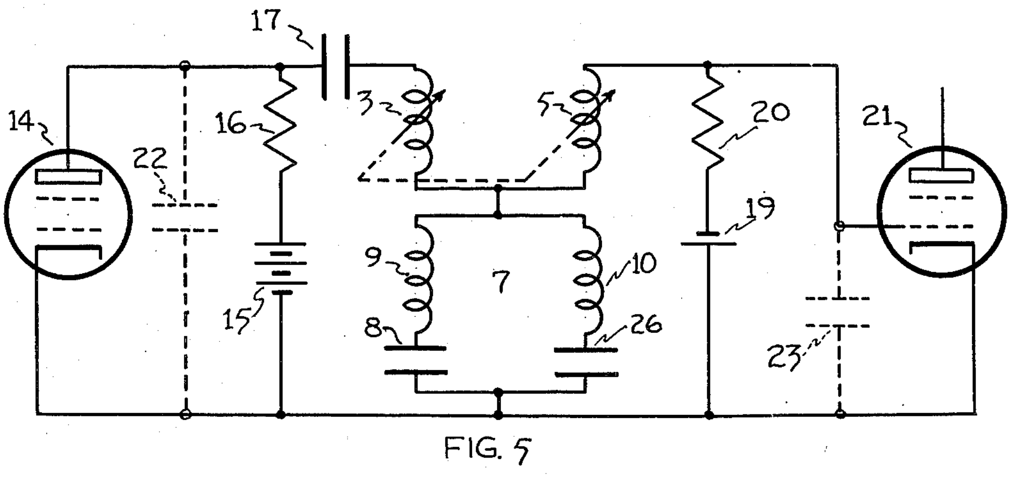

In order to explain the operation and advantages of my invention, I shall refer to the accompanying diagrams in which:

Fig. 1 is a band pass filter known to the art; Fig. 2 is a filter modified to embody my invention; Fig. 3 illustrates bandwidth vs. frequency characteristics of band pass filter, showing the bandwidth obtainable as a function of tuned center frequency, using several varities of tunable band pass filters; Figs. 4 and 5 are television amplifier circuits containing embodiments of my invention.

Referring to Fig. 1, a primary tuned circuit comprises a source of voltage 1 at controllable frequency in series with a capacitor 2, a variable inductor 3, and a coupling element, which coupling element in this case is a fixed inductance 4. Across the terminals of the coupling element 4 is a series combination of a second variable inductor 5 and a capacitor 6. This circuit is a well known band pass filter circuit, which has been thoroughly analyzed by C. B. Aiken, in his article "Two mesh tuned coupled circuit filters," Proceedings of the Institute of Radio Engineers, February 1937, and others, and can be tuned over a range of frequencies by means of the variable inductors 3 and 5.

In Fig. 2, illustrating my invention, the coupling element 4 has been replaced by a coupling network 7, containing a series connection of capacitance 8 and inductance 9, in parallel with an inductance 10. Capacitance 8 and inductance 9 are so selected that series resonance occurs at a frequency higher than the tunable range of the filter. The inductance 10 in combination with the series elements, capacitance 8 and inductance 9, provides parallel resonance at a frequency below the tunable range of the filter. In some physical embodiments of my invention there can be incorporated into the coupling capacitor 8 and leads enough inductance so that the additional series inductance element 9 is unnecessary.

In Fig. 3 are shown bandwidths obtained, using several types of coupling elements. From the circuit analysis, in the case of circuits coupled more than transitionally, bandwidth is approximately proportional to the product of midband frequency, hereinafter referred to as frequency, and coupling factor, which latter is the ratio of coupled reactance to total series reactance of the tuned circuits.

In the inductively coupled circuit of Fig. 1, the impedance of the coupling element increases directly with frequency. Since tuning is by means of variable inductance elements, the total reactance of each tuned circuit varies inversely with the frequency. Hence, the coupling factor increases with the square of the frequency, and the bandwidth increases approximately as the third power of the frequency, as shown in curve 11 of Fig. 3.

If the coupling inductance 4 be replaced by a capacitive coupling element, which normally varies in reactance inversely with frequency, the coupling coefficient will be constant with frequency, and bandwidth will be approximately proportional to frequency. This is shown in curve 12.

Using the coupling network of my invention, which contains both capacitance and inductance, there is obtained a bandwidth considerably more constant with frequency than that obtained using inductance or capacitance alone. This is shown in curve 13 of Fig. 3. This result appears even more surprising when it is noticed that over certain ranges at high and low ends of the frequency range, bandwidth decreases with increasing frequency, although in the case of inductive or capacitive coupling alone, bandwidth increases with frequency throughout the entire range.

The reason for this is believed to be as follows: If the frequency range is reasonably wide, the effects of the coupling inductances 9 and 10 are not great at frequencies in the center of the band, and bandwidth can increase with frequency as in the case of capacitive coupling. At the high frequency end of the band the effect of series inductance 9 becomes pronounced, causing the reactance of the network to be much less than that of the inductance 10 alone. This in turn, reduces bandwidth. The shape of the bandwidth curve at the high end can be controlled by the value of the series inductance 9 but will always have less variation than the curve of capacitive coupling, as shown in the high frequency end of Fig. 3. At the low frequency end, the bandwidth curve can be raised by the use of the parallel inductance 10, which increases the reactance of the network beyond that of the capacitance 8 alone, thus increasing the bandwidth. By use of either the series inductance 9 or the parallel inductance 10, but not both, in combination with capacitance 8, unsymmetrical compensation may be obtained, producing bandwidths more uniform than that of either inductive or capacitive coupling alone, but falling short of the results obtained here using the preferred network.

In Fig. 4 there is shown a television receiver input circuit using this invention. A tube 14 provides a signal, this being one of the amplifier tubes in a television receiver. A suitable source 15 of positive potential is connected to the anode of the tube 14 through a suitable load resistor 16. This load resistor 16 also provides damping resistance for the primary tuned circuit. The tube 14 is coupled to a first variable inductance element 3 through a small blocking capacitor 17. The coupling network connected in accordance with this invention is illustrated by the reference numeral 7 and comprises the elements as described above of a capacitance 8 in series with an inductance 9, this series connection being in parallel with an inductance 10. The coupling network 7 is coupled to a second tube 15 in the television receiver through a second variable inductance element 5 and a second blocking capacitor 18. A source 19 of negative potential is connected through a resistor 20 to the grid of the mixer tube 21 to provide bias voltage therefor. This grid resistor 20 also provides damping for the secondary circuit. The lumped capacitance of the tube, the elements and the wiring, etc., is illustrated in dotted lines by the reference numeral 22 and constitutes the primary tuned capacitance corresponding to the capacitance 2 illustrated in Fig. 2. Similarly, the lumped distributed capacitance of the secondary circuit including the input of the tube 21 is illustrated in dotted lines by the reference numeral 23 and corresponds to the capacitance 6 of Fig. 2. A local oscillator circuit 24 is coupled to the grid of tube 21 by means of a small capacitance 25.

Fig. 5 is a circuit similar to that of Fig. 4, except that a capacitor 26 has been added in series with the low frequency compensating inductance 10. The value of the capacitor 26 preferably is so chosen that it will resonate with the inductance 10 in series therewith substantially at the intermediate frequency of the receiver. This new element 26 has very little effect upon the operation of the filter within the pass band, but provides a convenient trap to prevent the passage of intermediate frequencies through the filter. Since the coupling network 7 has no direct current path to ground in this illustration, the blocking condenser 18 of Fig. 4 is unnecessary and has been omitted.

In the preferred form of the invention, the tuning inductances 3 and 5 are ganged together to be substantially equal to one another over the tuning range. Also primary and secondary circuits are tuned to the same frequency and are substantially equally damped. These conditions are by no means necessary to the successful operation of the invention, and if certain physical factors, such as damping, could be economically controlled, certain minor advantages might result from unequal damping or stagger tuning.

From the conditions that exist in the preferred form of my invention, namely, inductance tuning, and shunt damping of the tuned circuits, another advantage follows from the theory, and is actually very well realized in practice; namely, constant input impedance over a wide tuning range. When applied to an amplifier circuit, there results the very desirable condition of constant gain, signal-to-noise ratio, and time delay within the band. Outside of the band, because of the same factors, image and adjacent channel rejection are also constant, which is also desirable.

Although the preferred form of invention shows two tuned circuits coupled together, the invention applies to circuits containing three or more tuned circuits, and the desirable results of more constant bandwidth and impedance will be obtained. Similarly other modifications will be apparent to those skilled in the art without departing from the scope of the invention.

What is claimed is:

1. In a tuning circuit tunable over a range of frequencies and having a substantially fixed bandwidth of response, the combination of a first tuned circuit containing inductive and capacitive reactance elements connected in series, a second tuned circuit containing inductive and capacitive reactance elements connected in series, one of said reactance elements in each said circuit being variable, each said circuit being tunable over a predetermined range of frequencies and a coupling network connected jointly to said tuned circuits and providing impedance common to said first tuned circuit and said second tuned circuit, said coupling network containing inductance and capacitance series resonant at a frequency higher than the tunable range of said first tuned circuit and said second tuned circuit, and parallel resonant at a frequency lower than said tunable range.

2. In a tuning circuit tunable over a predetermined range of frequencies, and having a substantially fixed bandwidth of response the combination of a variable inductance, a capacitance, and a coupling network, said combination being connected in series electrically, said coupling network having across its terminals a series combination of a second variable inductance and a second capacitor, said coupling network containing inductance and capacitance series resonant at a frequency beyond one end of the tunable limits of said tuning circuit, and parallel resonant at a frequency beyond the other end of said tunable limits.

3. In a tuning circuit tunable over a predetermined range of frequencies, and having a substantially fixed bandwidth of response the combination of a variable inductance, a capacitance, and a coupling network, said combination being connected in series electrically, said coupling network having across its terminals a series combination of a second variable inductance and a second capacitor; said coupling network comprising a series combination of coupling inductance and a coupling capacitor resonant at a frequency higher than the tunable range of said tuning circuit, and a parallel combination of a coupling inductance and coupling capacitance resonant at a frequency lower than said tunable range.

4. In a tuning circuit tunable over a predetermined range of frequencies, and having a substantially fixed bandwidth of response the combination of a first variable inductance, a first capacitance, and a coupling network, said combination being connected in series electrically, said coupling network having across its terminals a series combination of a second variable inductance and a second capacitance, said coupling network comprising a coupling inductance in parallel with a series combination of a coupling capacitance and a second coupling inductance, said coupling network being series resonant at a frequency higher than the tuning range of said tuning circuit, and parallel resonant at a frequency lower than the tuning range of said tuning circuit.

5. A tuning circuit tunable over a predetermined range of frequencies and having a substantially fixed bandwidth of response, comprising two tunable resonant circuits each having inductive and capactive reactance elements connected in series, one of said reactance elements in each of said circuits being variable, and a two-terminal coupling network having one terminal connected jointly to said tunable circuits to provide a common electrical path for currents in said tunable circuits, said coupling network being parallel resonant below and series resonant above the tuning range of said tuning circuit.

6. In a superheterodyne receiver having intermediate frequency stages, a tuning circuit tunable over a predetermined range of frequencies and having a substantially fixed bandwidth of response and comprising a plurality of two-terminal tunable resonant circuits, and a two-terminal coupling network having one terminal connected jointly to one terminal of each of said resonant circuits to provide a common electrical path for currents in said resonant circuits, said coupling network being series resonant at a frequency above said predetermined range, parallel resonant at a frequency below said predetermined range, and series resonant at said intermediate frequency.

7. In a superheterodyne receiver having intermediate frequency stages, a band pass filter tunable over a predetermined range of frequencies and comprising a plurality of two-terminal tunable resonant circuits, and a two-terminal coupling network having one terminal connected jointly to one terminal of each of said resonant circuits, said coupling network comprising a first series combination of capacitance and inductance connected in parallel with a second series combination of capacitance and inductance, said network being series resonant at a frequency above said predetermined range, parallel resonant at a frequency below said predetermined range, and series resonant at said intermediate frequency.

FRED W. SCHMIDT, JR.

References Cited in the file of this patent

UNITED STATES PATENTS

| Number | Name | Date |
|---|---|---|
| 1,227,113 | Campbell | May 22, 1917 |
| 1,568,144 | Elsasser | Jan. 5, 1926 |
| 1,644,004 | Zobel | Oct. 4, 1927 |
| 1,800,996 | Gerth | Apr. 14, 1931 |
| 1,850,931 | Elliott | Mar. 22, 1932 |
| 2,001,090 | Bode | May 14, 1935 |
| 2,052,338 | Budenbom | Aug. 25, 1936 |
| 2,167,079 | Landon | July 25, 1939 |
| 2,206,388 | Buschbeck | July 2, 1940 |
| 2,250,519 | Beers | July 29, 1941 |
| 2,471,705 | Schmitt | May 31, 1949 |